US010950454B2

(12) United States Patent
Zhou et al.

(10) Patent No.: US 10,950,454 B2
(45) Date of Patent: Mar. 16, 2021

(54) INTEGRATED ATOMIC LAYER PASSIVATION IN TCP ETCH CHAMBER AND IN-SITU ETCH-ALP METHOD (71) Applicant: Lam Research Corporation, Fremont, CA (US)

(72) Inventors: Xiang Zhou, Santa Clara, CA (US); Tom A. Kamp, San Jose, CA (US); Yoshie Kimura, Fremont, CA (US); Duming Zhang, Union City, CA (US); Chen Xu, Pasadena, CA (US); John Drewery, Fremont, CA (US); Alex Paterson, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/669,871

(22) Filed: Aug. 4, 2017

(65) Prior Publication Data

US 2019/0043728 A1   Feb. 7, 2019

(51) Int. Cl.
*H01L 21/3065* (2006.01)
*H01L 21/67* (2006.01)
*H01J 37/32* (2006.01)

(52) U.S. Cl.
CPC .... *H01L 21/30655* (2013.01); *H01J 37/3211* (2013.01); *H01J 37/3244* (2013.01);
(Continued)

(58) Field of Classification Search
CPC .......... H01L 21/30655; H01L 21/67069; H01J 37/32119; H01J 37/3211; H01J 37/3244; H01J 2237/334
See application file for complete search history.

(56) References Cited

U.S. PATENT DOCUMENTS

2010/0062149 A1*  3/2010  Ma ..................... H01L 21/76841
                                                          427/126.1
2010/0173494 A1*  7/2010  Kobrin ................ H01L 21/0337
                                                             438/694
(Continued)

FOREIGN PATENT DOCUMENTS

KR        101711264 B1    2/2017
WO   WO-2016079498 A1 *  5/2016   ....... H01L 21/02178

OTHER PUBLICATIONS

S. Wolf and R.N. Tauber, (Silicon Processing for the VLSI Era, vol. 1—Process Technology, Lattice Press, 1986)(pp. 542-557) (Year: 1986).*

(Continued)

*Primary Examiner* — Binh X Tran
*Assistant Examiner* — Mahmoud Dahimene
(74) *Attorney, Agent, or Firm* — Penilla IP, APC (57) ABSTRACT A method for etching a substrate includes performing, in a plasma chamber, a first etch of a substrate material using a plasma etch process. The first etch forms features to a first depth in the material. Following the first etch, the method includes performing, in the plasma chamber without removing the substrate from the chamber, an atomic layer passivation (ALP) process to deposit a conformal film of passivation over the mask and the features formed during the first etch. The ALP process uses a vapor from a liquid precursor to form passivation over the features and the mask. The method further includes performing, in the plasma chamber, a second etch of the material using the plasma etch process. The conformal film of passivation is configured to protect the mask and sidewalls of the features during the second etch. A plasma processing system also is described.

16 Claims, 7 Drawing Sheets (52) U.S. Cl.
CPC .. *H01J 37/32119* (2013.01); *H01L 21/67069* (2013.01); *H01J 2237/334* (2013.01)

(56) References Cited

U.S. PATENT DOCUMENTS

| | | | |
|---|---|---|---|
| 2013/0118895 A1* | 5/2013 | Roozeboom | ........ C23C 16/0245 204/192.34 |
| 2014/0120727 A1* | 5/2014 | Subramanian | ...... H01L 21/3086 438/696 |
| 2015/0279971 A1 | 10/2015 | Xie et al. | |
| 2016/0343580 A1 | 11/2016 | Hudson | |
| 2017/0031370 A1 | 2/2017 | Drewery | |
| 2017/0076945 A1 | 3/2017 | Hudson et al. | |

OTHER PUBLICATIONS

PCT Notification of Transmittal of the International Search Report and the Written Opinion of the International Searching Authority (Forms PCT/ISA/220, 210, 237), dated Nov. 7, 2018, issued in corresponding International Application No. PCT/US2018/042560 (13 total pages).

\* cited by examiner

Bottom view

INTEGRATED ATOMIC LAYER PASSIVATION IN TCP ETCH CHAMBER AND IN-SITU ETCH-ALP METHOD

BACKGROUND

In semiconductor fabrication, for high-aspect ratio plasma etches, plasma-based passivation in the form of, for example, flashes and etch byproduct re-deposition has been used to maintain side wall profile and to avoid lateral etch into the device region. These plasma-based passivation techniques are not only aspect ratio dependent, which results in loading between isolated and dense features, but also material dependent, which results in loading between different materials. Plasma-based passivation, e.g., an $O_2$ flash, also consumes material on the target feature through oxidation and thereby causes critical dimension (CD) loss.

In current semiconductor fabrication processes, etch and atomic layer deposition (ALD) processes are carried out in separate platforms. Transporting wafers from one chamber to another chamber can be problematic because it entails vacuum breaks and increases the likelihood of unwanted particles coming into contact with the wafers. Moreover, the cleaning process, which is typically a dilute HF acid clean, has an impact on the mask and thereby negatively impacts performance. The use of separate chambers also has an adverse impact on throughput.

It is in this context that embodiments arise.

SUMMARY

In an example embodiment, a method for etching a substrate in a plasma chamber includes receiving the substrate in the plasma chamber over a bottom electrode. The substrate has a material to be etched to form features, with a mask being provided over the substrate to define locations of the features to be etched. The method further includes performing, in the plasma chamber, a first etch of the material using a plasma etch process. The first etch uses plasma etch gases to form features to a first depth in the material. Following the first etch, the method includes performing, in the plasma chamber, an atomic layer passivation (ALP) process to deposit a conformal film of passivation over the mask and the features formed during the first etch. The ALP process includes (a) introducing a vapor of a liquid precursor into the plasma chamber to coat an amount of precursor over the mask and the features, (b) curing the amount of precursor to form an atomic monolayer of said conformal layer of passivation, and (c) repeating the introducing of the vapor of the liquid precursor in (a) and the curing of the amount of precursor in (b) until a conformal film of passivation having a target thickness is formed without removal of the substrate from the plasma chamber. Following the ALP process, the method further includes performing, in the plasma chamber, a second etch of the material using the plasma etch process. The second etch uses plasma etch gases to form features to a second depth in the material, with the conformal film of passivation being configured to protect the mask and sidewalls of the features during the second etch.

In one embodiment, the conformal film of passivation is configured to enable etching of the features to the second depth with either a) minimal critical dimension loss, or b) minimal critical dimension loading between different materials and different aspect ratios, or c) minimal profile loading between different materials and different aspect ratios.

In one embodiment, the vapor of a liquid precursor is introduced into the plasma chamber using a liquid delivery system, and the plasma etch gases are introduced into the plasma chamber using an etch gas delivery system. The liquid delivery system and the etch gas delivery system are coupled to manifolds controlled by a controller to introduce the plasma etch gases during the first etch and second etch of the material and to introduce the vapor of the liquid precursor during the ALP process.

In one embodiment, during the ALP process, the curing of the amount of precursor includes applying radio frequency (RF) power to electrodes of the plasma chamber along with an oxygen gas to perform a plasma flash process. The plasma flash process can be processed for a period of time that is between about 0.5 second and about 4 seconds, and the RF power can be applied at a power level that is between about 200 watts and about 3,000 watts.

In one embodiment, during the ALP process, a purge of the plasma chamber is conducted after performing (a) and (b), wherein an ALP cycle is completed each time (a) and (b) is repeated. In one embodiment, each ALP cycle produces a single atomic monolayer, and a conformal film having a specific target thickness can be formed by performing a specific number of the ALP cycles. In one embodiment, during the APL process, each time (a) and (b) is repeated, a single atomic monolayer of the conformal film of passivation is formed, and the thickness of the conformal film of passivation is defined by the single atomic monolayer or a plurality of atomic monolayers.

In one embodiment, the method further includes performing one or more additional etches after the second etch, wherein before each additional etch is performed, an ALP process is performed to form a respective conformal film of passivation. The conformal film of passivation is defined by repeating (a) and (b) a number of times to reach the target thickness of the conformal film of passivation. In one embodiment, the conformal film of passivation is deposited over the sidewalls of the features and the mask, without consuming any significant amount of material of the sidewalls of the features. In one embodiment, the material to be etched is comprised of silicon, or silicon germanium, or germanium, and the conformal film of passivation does not consume any significant amount of material in the sidewalls of the features and forms passivation of substantially a same quality over different materials.

In another example embodiment, a plasma processing system includes a chamber including a processing region, a bottom electrode disposed in the chamber below the processing region, and a dielectric window disposed over the processing region and above the bottom electrode. A coil is disposed above the dielectric window for providing radio frequency (RF) power to the processing region. The plasma processing system also includes an etch gas delivery system coupled to one or more gas sources used for performing a first etch of a material of a substrate to form features when disposed over the bottom electrode. The etch gas delivery system has an output coupled to manifolds. The plasma processing system further includes a liquid delivery system including a source of liquid precursor, a liquid flow controller coupled to the source of liquid precursor, and a vaporizer coupled to the liquid flow controller. The liquid delivery system has an output coupled to the manifolds, with the manifolds being controlled by a controller. The controller is configured to activate the etch gas delivery system to perform the first etch and is configured to activate at least the liquid delivery system to perform an atomic layer passivation (ALP) process after the first etch to coat the features formed during the first etch with a conformal film of passivation. The ALP process can be completed one or more times and each time a single atomic monolayer of the conformal film of passivation is formed. The controller is also configured to activate the etch gas delivery system to perform a second etch of the features, with the conformal film of passivation being configured to protect the mask and sidewalls of the features during the second etch.

In one embodiment, the conformal film of passivation is configured to enable etching of the features to the second depth with either a) minimal critical dimension loss, or b) minimal critical dimension loading between different materials and different aspect ratios, or c) minimal profile loading between different materials and different aspect ratios.

In one embodiment, during the ALP process, the controller is configured to activate the liquid flow controller and the vaporizer and then activate the RF power to the coil to cure an amount of precursor generated by the vaporizer and applied over the features, with the RF power being activated along with an oxygen gas.

In one embodiment, the chamber includes a vacuum system, which can be activated by the controller after each time the ALP process is completed. In one embodiment, a bias power is coupled to the bottom electrode during the first etching and second etching, and during a curing of an amount of precursor generated by the vaporizer and applied over the features. The bias power is coupled to the controller for processing the first etching, the second etching, and the ALP process.

In one embodiment, an injector is disposed in the dielectric window. The injector provides a path coupling outputs of the manifolds to the chamber. In one embodiment, one or more side injectors are disposed in sidewalls of the chamber, with the one or more side injectors being coupled to one or more paths to outputs of the manifolds. In one embodiment, the manifolds include a plurality of valves for switching between gases provided during the first etch and the second etch and vapor provided during the ALP process.

In one embodiment, the first etch, the second etch, and the ALP process are conducted within the chamber, without removal of the substrate from the chamber, to form the conformal film of passivation that protects the sidewalls of the features during the second etch.

In yet another example embodiment, a method for etching a substrate in a plasma chamber includes receiving the substrate in the plasma chamber over a bottom electrode. The substrate has a material to be etched to form features, and a mask is provided over the substrate to define locations of the features to be etched. The method further includes performing, in the plasma chamber, a first etch of the material using a plasma etch process. The first etch uses plasma etch gases to form features to a first depth in the material. Following the first etch, the method includes performing, in the plasma chamber without removing the substrate from the plasma chamber, an atomic layer passivation (ALP) process to deposit a conformal film of passivation over the mask and the features formed during the first etch. The ALP process uses a vapor from a liquid precursor to form a conformal film of passivation over the features and the mask. Following the ALP process, the method includes performing, in the plasma chamber, a second etch of the material using the plasma etch process to form the features to a second depth in the material, the conformal film of passivation being configured to protect the mask and sidewalls of the features during the second etch.

In one embodiment, the ALP process includes: (a) introducing the vapor of the liquid precursor into the plasma chamber to coat an amount of precursor over the mask and the features; (b) curing the amount of precursor to form an atomic layer of the conformal layer of passivation; and (c) repeating the introducing of the vapor of the liquid precursor in (a) and curing of the amount of precursor in (b) until a conformal film of passivation having a target thickness is formed.

In one embodiment, the vapor of a liquid precursor is introduced into the plasma chamber using a liquid delivery system, and the plasma etch gases are introduced into the plasma chamber using an etch gas delivery system. The liquid delivery system and the etch gas delivery system are coupled to manifolds controlled by a controller to introduce the plasma etch gases during the first etch and the second etch of the material and to introduce the vapor of the liquid precursor during the ALP process.

In one embodiment, during the ALP process, a purge of the plasma chamber is conducted after performing (a) and (b), wherein an ALP cycle is completed each time (a) and (b) is repeated. In one embodiment, each ALP cycle produces a single atomic monolayer, and a conformal film having a specific target thickness can be formed by performing a specific number of the ALP cycles with a substantially same thickness and substantially same quality on different materials and different aspect ratios. In one embodiment, during the ALP process, each time (a) and (b) is repeated, a single atomic monolayer of the conformal film of passivation is formed, and the thickness of the conformal film of passivation is defined by the single atomic monolayer or a plurality of atomic monolayers.

Other aspects and advantages of the disclosures herein will become apparent from the following detailed description, taken in conjunction with the accompanying drawings, which illustrate by way of example the principles of the disclosures.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, process operations and implementation details have not been described in detail, if already well known.

Embodiments of the present invention provide for the use of atomic layer passivation (ALP) in a plasma etch chamber. By using in-situ atomic layer passivation (ALP) rather than either 1) atomic layer deposition (ALD) conducted in a separate chamber or 2) plasma-based passivation, process windows are widened for the simultaneous etch of different materials at high aspect ratios. Further, in ALP, the passivation material is supplied with a controlled chemical composition, with the result that no significant amount of material is consumed from the etching structure. In contrast, in plasma-based passivation schemes, the passivation materials are formed by either oxidation or nitration which consumes substrate material. Moreover, there is a lack of control of the chemical composition if the passivation material is formed by an etch by-product. Still further, because the ALP process is conformal, the ALP process is aspect ratio independent, whereas plasma-based passivation is aspect ratio dependent.

Figure 1:
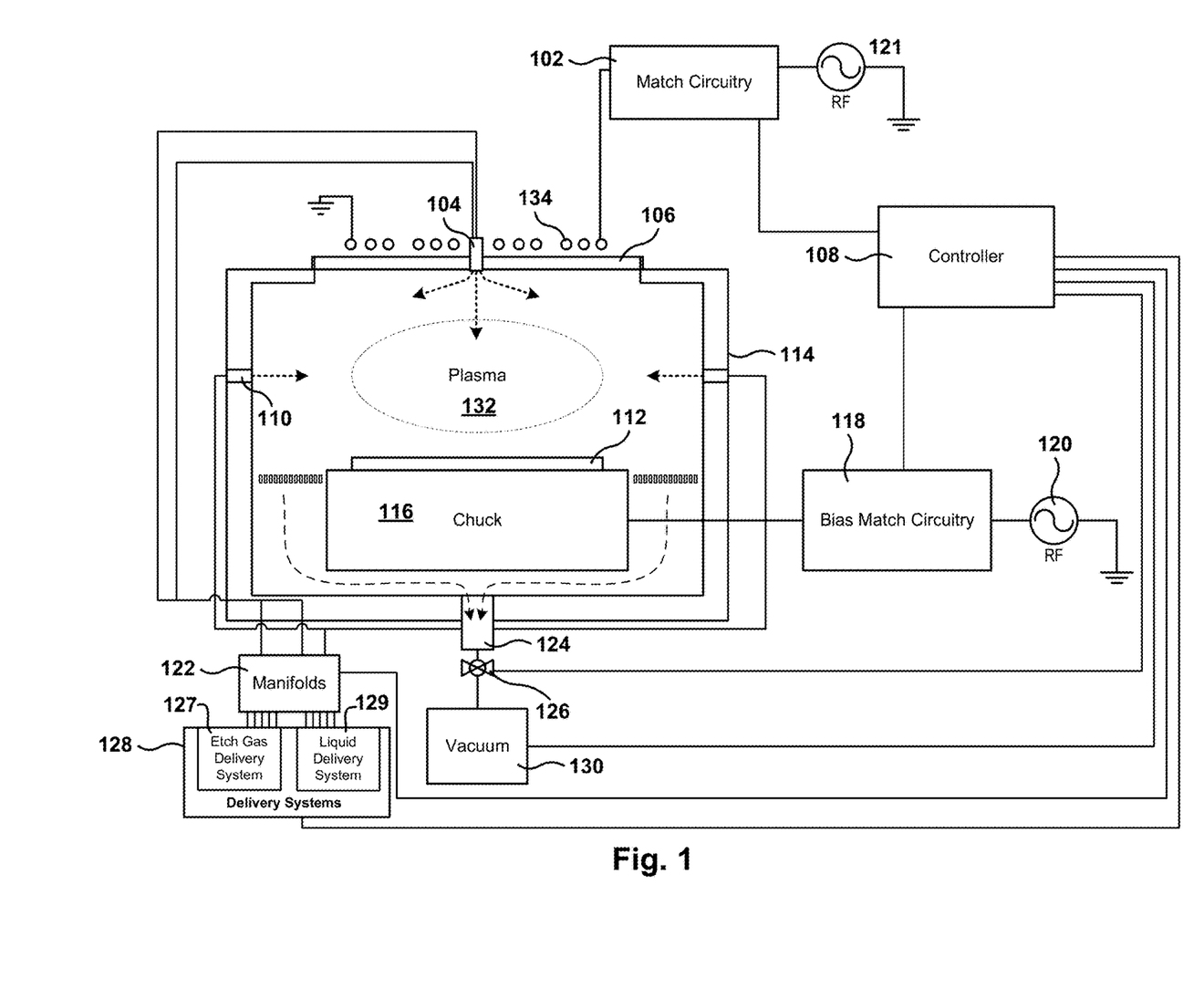
FIG. 1 is a schematic cross-sectional diagram showing a plasma processing system used for etching operations, in accordance with one embodiment.

FIG. 1 is a schematic cross-sectional diagram showing a plasma processing system used for etching operations, in accordance with one embodiment. The system includes a chamber 132 that includes a chamber body 114, a chuck 116, and a dielectric window 106. The chamber 132 includes a processing region and the dielectric window 106 is disposed over the processing region. The chuck 116 can be an electrostatic chuck for supporting a substrate 112 and is disposed in the chamber below the processing region. In some embodiments, an internal Faraday shield (not shown) is disposed inside the chamber 100 beneath the dielectric window 106. A TCP coil 134 is disposed over the dielectric window 106 and is connected to match circuitry 102.

The system includes a bias RF generator 120, which can be defined from one or more generators. If multiple generators are provided, different frequencies can be used to achieve various tuning characteristics. A bias match 118 is coupled between the RF generators 120 and a conductive plate of the assembly that defines the chuck 116. The chuck 116 also includes electrostatic electrodes to enable the chucking and dechucking of the wafer. Broadly, a filter and a DC clamp power supply can be provided. Other control systems for lifting the wafer off of the chuck 116 can also be provided.

A first gas injector 104 provides two different channels to inject two separate streams of process gases or liquid precursor (in vapor form) to the chamber from the top of the chamber. It should be appreciated that multiple gas supplies may be provided for supplying different gases to the chamber for various types of operations, such as process operations on wafers, waferless auto-cleaning (WAC) operations, and other operations. A second gas injector 110 provides another gas stream that enters the chamber through the side instead of from the top.

Delivery systems 128 include, in one embodiment, an etch gas delivery system 127 and a liquid delivery system 129. Manifolds 122 are used for selecting, switching, and/or mixing outputs from the respective delivery systems. As will be described in more detail below, the etch gas delivery system is configured to output etchant gases that are optimized to etch one or more layers of materials of a substrate. The manifolds 122 are further optimized, in response to control from the controller 108, to perform atomic layer passivation (ALP). An atomic layer passivation (ALP) process, in one embodiment, is performed in one or more cycles, where each cycle produces a self-limiting atomic monolayer of passivation over the features being etched over the substrate. In the ALP process, a liquid precursor is vaporized and delivered in vapor form into the chamber 132, to dose the wafer surface to saturation. It is noted that dosing the wafer surface to saturation is also known as "soaking" the wafer surface to saturation. Once the wafer is dosed with precursor, the delivery of the vapor is stopped by the manifolds 122. The dosed wafer is subjected to a flash process, which includes powering the chamber using the RF generators 121 and 120 and delivering oxygen ($O_2$) to the chamber, to cure the precursor. This flash process is referred to as an "$O_2$ flash" operation, as the time during which RF power is delivered is relatively fast, e.g., between about 0.5 second and about 4 seconds. Once the $O_2$ flash operation is completed, the chamber is purged.

In the ALP process, any suitable liquid precursor capable of forming a conformal atomic layer can be used. By way of non-limiting example, the liquid precursor can have a composition of the general type $C(x)H(y)N(z)O(a)Si(b)$. In some embodiments, the liquid precursor has one of the following compositions: $C_6H_{19}N_3Si$, $C_8H_{22}N_2Si$, $C_9H_{23}NO_3Si$, and $C_{12}H_{28}O_4Si$.

Once a number of cycles are processed, each forming a respective self-limiting ALP layer, the etching operation is resumed. Generally speaking, etching gases are also referred to as reactant gas that is a source of the species necessary for etching features of the substrate. Examples of reactant gases include chlorine ($Cl_2$), hydrogen bromide (HBr), and sulfur hexafluoride ($SF_6$), but other reactant gases may also be used.

In the embodiment of FIG. 1, independent gas streams may be delivered into the chamber. One stream can be injected through a center of injector 104. A second stream can be injected also through injector 104, but via a different path that surrounds the center of injector 104. The third stream may be injected into the side of the chamber via side injector 110. In one embodiment, gas injector 104 also provides for optical access into the process chamber, for example, along an axial path from a diagnostic endpoint outside the process chamber through an optical access window. More details for optical access into the chamber may be found in U.S. Pat. No. 7,928,366, entitled "Methods of and Apparatus for Accessing a Process Chamber Using a Dual Zone Gas Injector with Improved Optical Access," and issued on Apr. 19, 2011, the disclosure of which is incorporated herein by reference.

The various ways of injecting gases into the chamber have been described to illustrate that the etch gases and/or the liquid precursor can be provided into the chamber from various locations. In some cases, only the injector 104 is used. In other cases, only the side injector 110 is used. In other cases, both the injector 104 and the side injector 110 may be used. In one configuration, manifolds 122 control which gases are supplied to each of the three different gas lines. Manifolds 122 allow for any type of gas (reactant, tuning, precursor, etc.) to be provided to any of the three different gas lines. In some embodiments tuning gases can include gases such as oxygen ($O_2$), helium (He), and methane ($CH_4$). The gases may be sent into the chamber without mixing, or be mixed with other gases before introduction into the chamber.

Figure 2A:
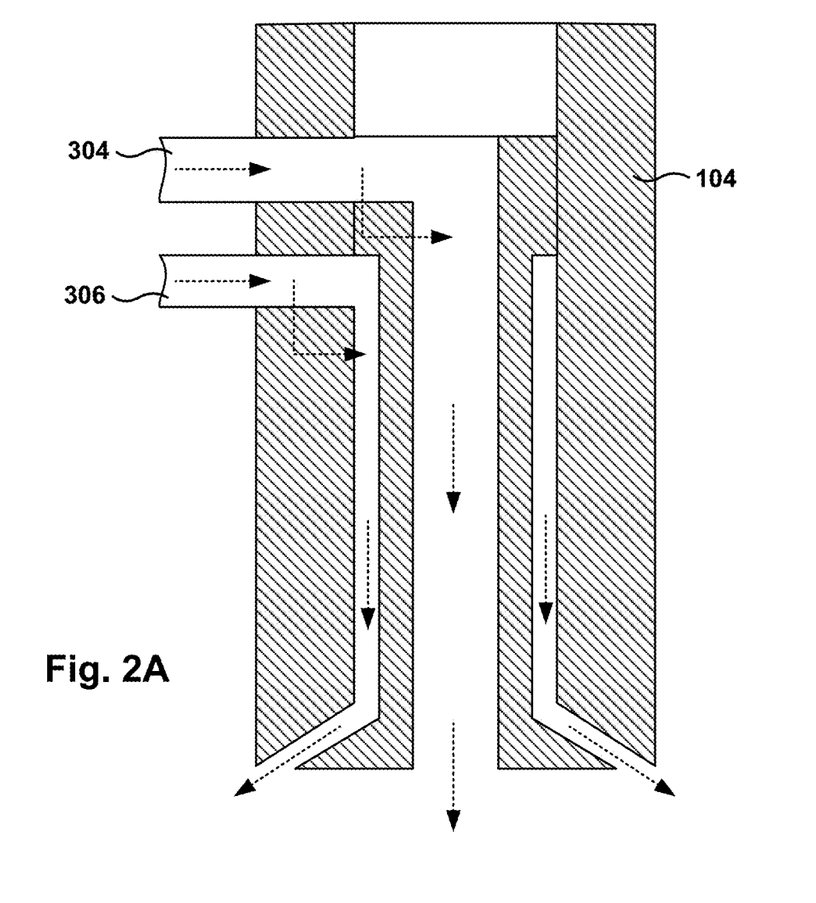
FIGS. 2A and 2B provide a sectional view and a bottom view, respectively, of a gas injector, according to one embodiment.
Figure 2B:
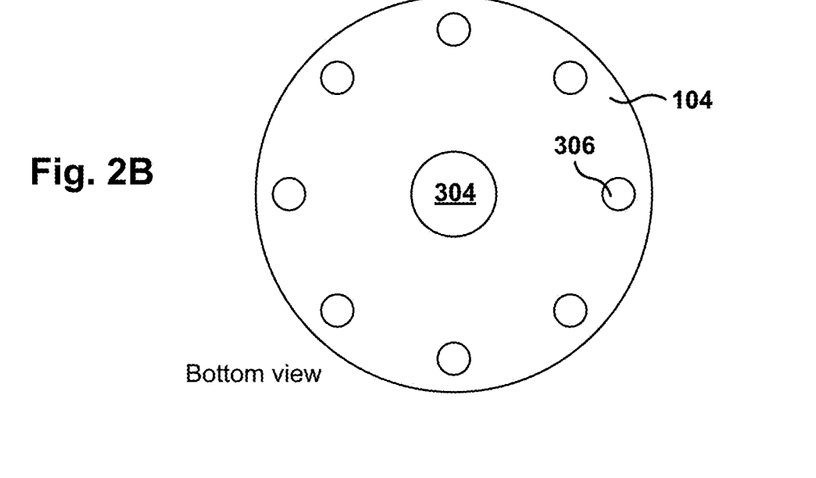

FIGS. 2A and 2B provide a sectional view and a bottom view, respectively, of the gas injector 104, according to one embodiment. Injector 104 includes two different gas channels: a first gas channel 304 for introducing a first stream into the chamber through the center, and the second gas channel 306 for introducing a second gas stream through the outer channel (e.g., edge channel). The second gas channel 306 can include a plurality of outlets defined in the bottom of injector 104. In the embodiment shown in FIG. 2B, the second gas channel 306 has eight (8) outlets defined in the bottom of injector 104 and the outlets are spaced apart around the periphery of the bottom of the injector by about 45 degrees.

Referring back to FIG. 1, a vacuum pump 130 is connected to the chamber 132 to enable vacuum pressure control and removal of gaseous byproducts from the chamber during operational plasma processing. A valve 126 is disposed between exhaust 124 and the vacuum pump 130 to control the amount of vacuum suction being applied to the chamber.

The dielectric window 106 can be defined from a ceramic material or a ceramic-type material. Other dielectric materials are also possible, so long as they are capable of withstanding the conditions of a semiconductor etching chamber. Typically, chambers operate at elevated temperatures ranging between zero degrees Celsius and approximately 200 degrees Celsius. The temperature will depend on the etching process operation and specific recipe. The chamber 132 will also operate at vacuum conditions in the range of between about 1 mTorr (mT) and about 500 mTorr (mT). As used herein, the terms "about" and "approximately" mean that the specified parameter can be varied within a reasonable tolerance, e.g., ±20%.

Although not all specifically shown, chamber 132 is typically coupled to facilities when installed in either a clean room or a fabrication facility. Facilities include plumbing that provide, among other things, processing gases, vacuum, temperature control, and environmental particle control. These facilities are coupled to chamber 132, when installed in the target fabrication facility. Additionally, chamber 132 may be coupled to a transfer chamber that will enable robotics to transfer semiconductor wafers into and out of chamber 132 using automation.

A programmable controller 108 is provided for controlling the operation of the chamber 132 and its associated components. Broadly speaking, the controller 108 can be programmed to execute a chamber operation defined by a recipe. A given recipe may specify various parameters for the operation, such as the application of power to the TCP coils, the flow of gas into the chamber, and the application of vacuum. It should be appreciated that the timing, duration, magnitude, or any other adjustable parameter or controllable feature can be defined by a recipe and carried out by the controller to control the operation of the chamber 132 and its associated components. Additionally, a series of recipes may be programmed into the controller 108. In one embodiment, the recipe is configured to process etch operations and includes one or cycles of an atomic layer passivation (ALP) process performed in between each of the etch operations.

In one embodiment, the controller is configured to activate the etch gas delivery system to perform the first etch. In this embodiment, the controller is also configured to activate at least the liquid delivery system to perform an atomic layer passivation (ALP) process after the first etch to coat the features formed during the first etch with a conformal film of passivation. In one embodiment, the features are coated by first dosing the wafer surface to saturation with precursor and then curing the precursor to form the film of passivation. The ALP process can be completed one or more times and each time a single atomic monolayer of the conformal film of passivation is formed. In one embodiment, the controller is further configured to activate the etch gas delivery system to perform a second etch of the features. During the second etch, the conformal film of passivation protects the mask and sidewalls of the features to enable features to be defined during the second etch with minimal critical dimension (CD) loss, minimal CD loading between different materials and aspect ratios, and minimal profile loading between different materials and aspect ratios. In one embodiment, the controller is still further configured to activate the liquid flow controller and the vaporizer and then activate the RF power to the coil to cure an amount of the precursor generated by the vaporizer and applied over the features. In this embodiment, the RF power is activated along with an oxygen gas, which may be provided using the etch gas delivery system. In one embodiment, the controller is configured to activate a vacuum system or turbopump after each time the ALP process is completed to purge the chamber.

Figure 3A:
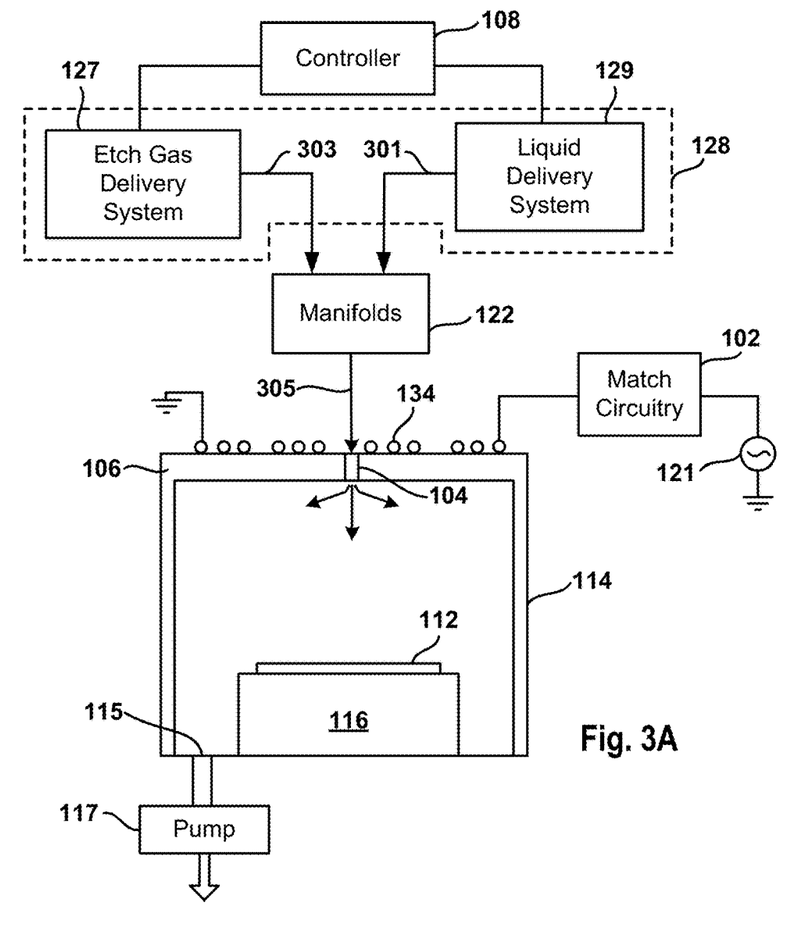
FIG. 3A is a schematic cross-sectional diagram of a plasma processing system used for etching operations, in accordance with one embodiment.

FIG. 3A is a schematic cross-sectional diagram of a plasma processing system used for etching operations, in accordance with one embodiment. As shown in FIG. 3A, chuck 116 is disposed within chamber body 114, which is provided with dielectric window 106. In one embodiment, chuck 116 is an electrostatic chuck for supporting a substrate 112. A TCP coil 134 is disposed over the dielectric window 106 and is connected to match circuitry 102, which is coupled to RF generator 121. In the embodiment of FIG. 3A, delivery systems 128 include etch gas delivery system 127 and liquid delivery system 129. Etch gas delivery system 127 delivers etchant gases to manifolds 122 via conduit 303. Liquid delivery system 129 delivers liquid precursor (in vapor form) to manifolds 122 via conduit 301, as will be explained in more detail below with reference to FIG. 3B. The manifolds 122, in response to control from controller 108, enable the outputs from the respective delivery systems to flow to the chamber body 114 via conduit 305 at the appropriate times by selecting, switching, and/or mixing the outputs using, for example, a plurality of valves for switching between gases and/or vapor. The outputs from the respective delivery systems flow from conduit 305 into the chamber body 114 via gas injector 104, which is located at the top of the chamber body. To facilitate purging of the chamber, the base of chamber body 114 is provided with an outlet 115, which is connected in flow communication with a pump 117. In one embodiment, the pump 117 is a turbopump. Those skilled in the art will appreciate that the base of chamber body 114 can be provided with multiple outlets each of which is connected to a suitable pump.

Figure 3B:
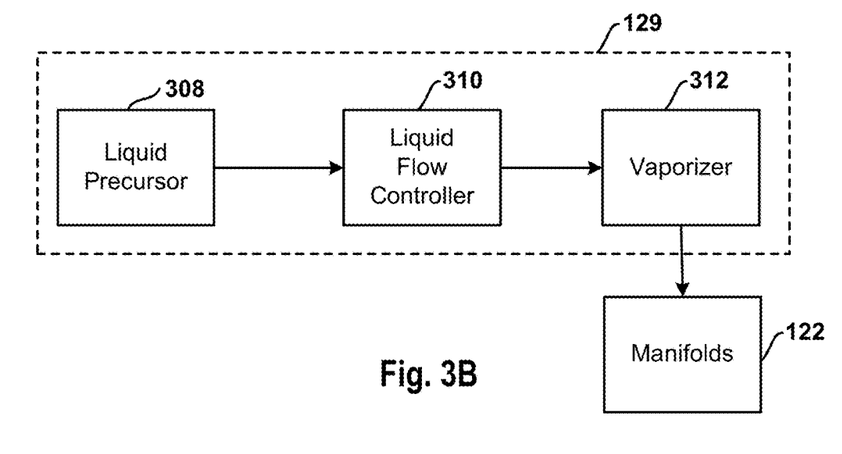
FIG. 3B is a schematic diagram that illustrates additional details of the liquid delivery system, in accordance with one embodiment.

FIG. 3B is a schematic diagram that illustrates additional details of the liquid delivery system, in accordance with one embodiment. As shown in FIG. 3B, liquid delivery system 129 includes a source of liquid precursor 308, a liquid flow controller 310, and a vaporizer 312. The source of liquid precursor 308 can be coupled in flow communication to facilities that provide suitable liquid precursors. As stated above, any liquid precursor capable of forming a conformal atomic monolayer can be used. The liquid precursor flows from source 308 to liquid flow controller 310, which regulates the amount of flow based on instruction received from controller 108 (see, e.g., FIG. 3A). In one embodiment, the amount of the liquid precursor is in the range from about 50 microliters to about 1,000 microliters. The liquid precursor flows from the liquid flow controller 310 to vaporizer 312, which converts the liquid precursor from the liquid state to the vapor state. The vaporized precursor flows to manifolds 122, which, based on control received from the controller 108, supplies the vaporized precursor to gas injector 104 (see, e.g., FIG. 1) at the appropriate time. The vaporized precursor flows through gas injector 104 into the chamber 132 defined by chamber body 114 (see, e.g., FIG. 1).

Figure 4A:
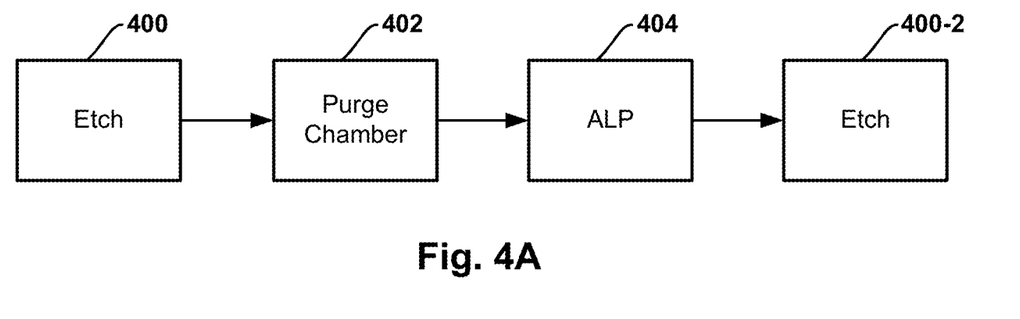
FIG. 4A is a flow diagram illustrating the method operations performed in etching a substrate, in accordance with an example embodiment.

FIG. 4A is a flow diagram illustrating the method operations performed in etching a substrate, in accordance with an example embodiment. In operation 400, a substrate, e.g., a wafer, is etched in accordance with well-known techniques. In one embodiment, the substrate is received in a plasma chamber, e.g., a TCP etch chamber, over a bottom electrode. The substrate has a material to be etched, e.g., a conductor, to form features in the material and a mask is provided over the substrate to define locations of the features to be etched. The plasma etch process uses plasma etch gases to form the features in the material. In one embodiment, a first etch is performed to form the features in the material to a first depth. The first depth can be any suitable percentage of the final depth, e.g., 20%, 30%, 40%, 50%, etc. As will be explained in more detail below, a second etch may be subsequently performed to form the features in the material to a second depth. In one embodiment, the second depth is the final depth; however, it will be appreciated by those skilled in the art that more than two etch processes can be performed to define features to the final depth. After the etching operation, e.g., the first etch, is complete, in operation 402, the chamber is purged. Referring back to FIG. 3A, in one embodiment, the chamber is purged via outlet 115, which is coupled in flow communication with pump 117.

Once the chamber is purged, in operation 404, atomic layer passivation (ALP) is performed in the plasma chamber. In the ALP operation, a conformal layer of passivation is deposited over the mask and features formed during the etch operation, e.g., the first etch. Additional details regarding the ALP operation are described below with reference to FIG. 4B. Upon completion of the ALP operation, which can be repeated multiple times to form a passivation film having a thickness greater than a single atomic monolayer, in operation 400-2, a second etch of the material using the plasma etch process is performed to define the features in the material to a second depth. During the second etch, the conformal layer of passivation protects the mask and sidewalls of the features to enable etching of the features to the second depth.

Figure 4B:
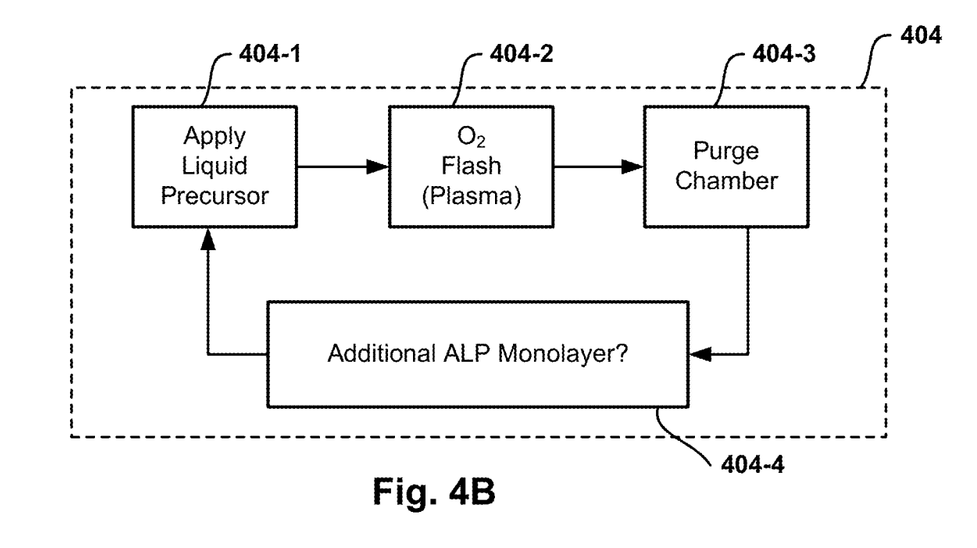
FIG. 4B is a flow diagram that illustrates additional details regarding the atomic layer passivation (ALP) operation performed in the etching of a substrate, in accordance with an example embodiment.

FIG. 4B is a flow diagram that illustrates additional details regarding the atomic layer passivation (ALP) operation performed in the etching of a substrate, in accordance with an example embodiment. In one embodiment, the ALP operation (see operation 404 in FIG. 4A) includes operations 404-1, 404-2, 404-3, and 404-4. In operation 404-1, liquid precursor is applied to the surface of the substrate to dose the substrate surface to saturation. Examples of suitable precursors have been listed above in connection with description of FIG. 1. In one embodiment, a liquid delivery system (LDS) is used to supply the liquid precursor to the chamber. By way of example, liquid delivery system (LDS) 129 shown in, for example, FIGS. 3A and 3B, can be used to supply the liquid precursor to the chamber. As described above, LDS 129 vaporizes the liquid precursor and delivers the vaporized precursor to the chamber. Once a substrate, e.g., a wafer, has been dosed with the precursor, in operation 404-2, an $O_2$ flash is performed to cure the precursor and form a conformal atomic monolayer of passivation over the mask and features formed in a material during a plasma etch process, e.g., a first etch. The $O_2$ flash is carried out by powering the RF generators of a plasma chamber (e.g., RF generators 121 and 120 shown in FIG. 1) and introducing oxygen ($O_2$) into the chamber. By way of example, the oxygen can be introduced into the chamber using etch gas delivery system 127 shown in, for example, FIGS. 1 and 3A. In one embodiment, the oxygen is introduced into the chamber at a flow rate in the range from about 500 sccm to about 2,500 sccm. In one embodiment, the RF power is applied at a power level that is between about 200 watts and about 3,000 watts. Upon completion of the $O_2$ flash, which typically takes about 0.5 second to about 4 seconds, in operation 404-3, the chamber is purged. The chamber can be purged using a suitable pump in flow communication with an outlet of the chamber. By way of example, pump 117 shown in flow communication with outlet 115 (see FIG. 3A) can be used to purge the chamber. In one embodiment, pump 117 is a turbopump. In one embodiment, the purge operation takes approximately 2 seconds and one cycle of the ALP operation lasts for a period of time that ranges from about 4 seconds to about 15 seconds.

In operation 404-4, a determination is made as to whether an additional ALP monolayer is to be formed. If an additional ALP monolayer is not needed, then the method of etching a substrate proceeds from ALP operation 400 to etch operation 400-2, as illustrated in FIG. 4A. If an additional ALP monolayer is to be formed, then operations 404-1, 404-2, and 404-3 are repeated to form another ALP monolayer. The formation of an ALP monolayer by performing operation 404-1, 404-2, and 404-3 can be repeated for a number of cycles to achieve a level of passivation sufficient for a particular application. As each ALP monolayer typically has a thickness in the range from about 1.0 angstrom to about 1.3 angstroms, the ALP operation can include multiple cycles to form an overall passivation film having a desired target thickness, e.g., 5 angstroms, 10 angstroms, 20 angstroms, etc. In one embodiment, the ALP operation includes 1-100 cycles. In other embodiments, the ALP operation can include 1-10 cycles, 10-60 cycles, 20-30 cycles, etc.

Figure 5:
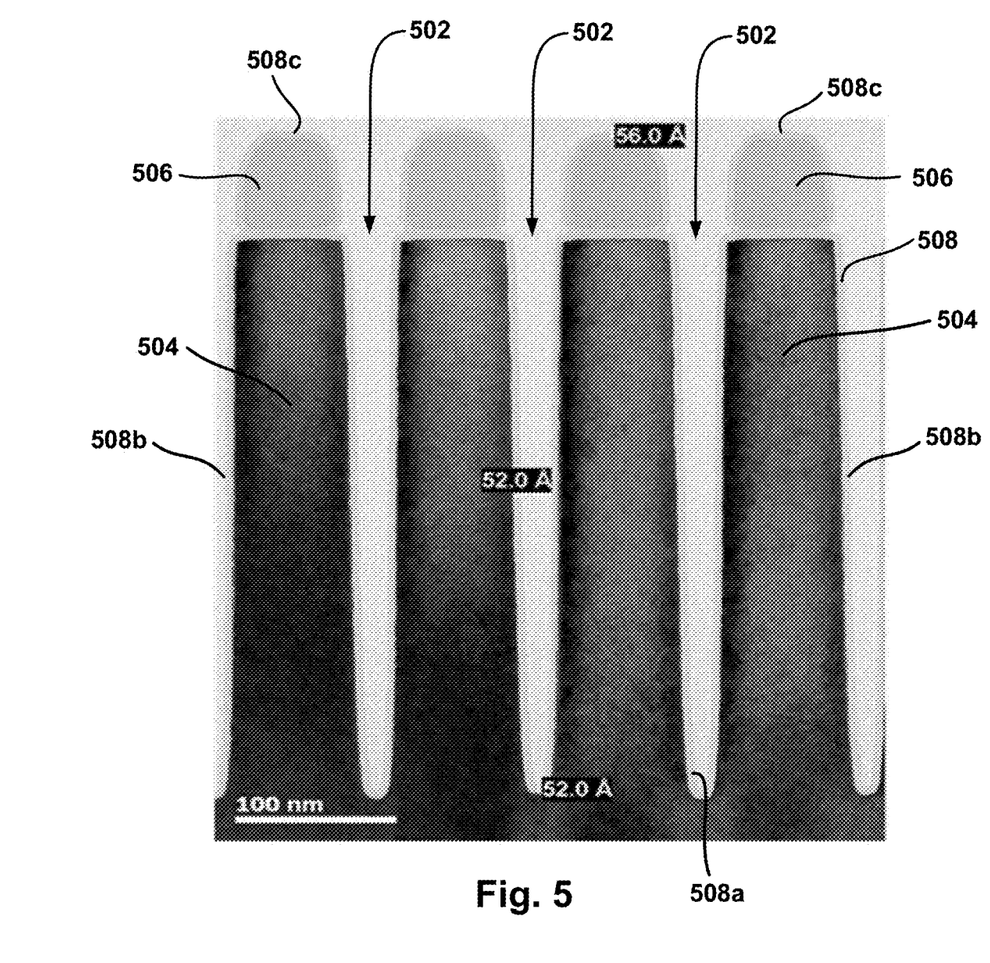
FIG. 5 illustrates an example of a shallow trench isolation (STI) feature having a conformal atomic layer passivation (ALP) film deposited over the STI feature, with the STI feature being etched and the ALP film being deposited in the same chamber in accordance with one embodiment.

FIG. 5 illustrates an example of a shallow trench isolation (STI) feature having a conformal atomic layer passivation (ALP) film deposited over the STI feature, with the STI feature being etched and the ALP film being deposited in the same chamber in accordance with one embodiment. As shown in FIG. 5, the STI feature includes a plurality of trenches 502 that have been etched into a conductive material, e.g., silicon, to define a plurality of structures 504. The mask 506 used during the etching process remains above a top region of each of the structures 504. In one embodiment, the mask 506 is formed of silicon nitride; however, other suitable mask materials also may be used. The ALP film 508 covers the surfaces of the trenches 502 and the structures 504 in a conformal manner. As indicated by the lower thickness indicator shown in FIG. 5, the conformal ALP film 508a in the region near the bottom of trenches 502 has a thickness of about 52 angstroms. As indicated by the middle thickness indicator shown in FIG. 5, the conformal ALP film 508b in the region along the sidewalls of the structures 504 also has a thickness of about 52 angstroms. As indicated by the top thickness indicator shown in FIG. 5, the conformal ALP film 508c in the region surrounding the mask 506 has a thickness of about 56 angstroms. Thus, the thickness indicators located at the top of the structures, along the sidewalls of the structures, and near the bottom of the structures demonstrate the conformal nature of the ALP film deposited over the structures. It is noted that ALP also deposits the same amount across different aspect ratios, and deposits uniformly across the substrate, e.g., wafer.

As set forth above, the typical ALP monolayer has a thickness in the range from about 1.0 angstrom to about 1.3 angstroms. Thus, to deposit a conformal ALP film having a thickness of about 50 angstroms as shown in the example of FIG. 5, the ALP operation would have to be repeated for at least 35-40 cycles (assuming ALP monolayer has a thickness of about 1.3 angstroms).

Figure 6A:
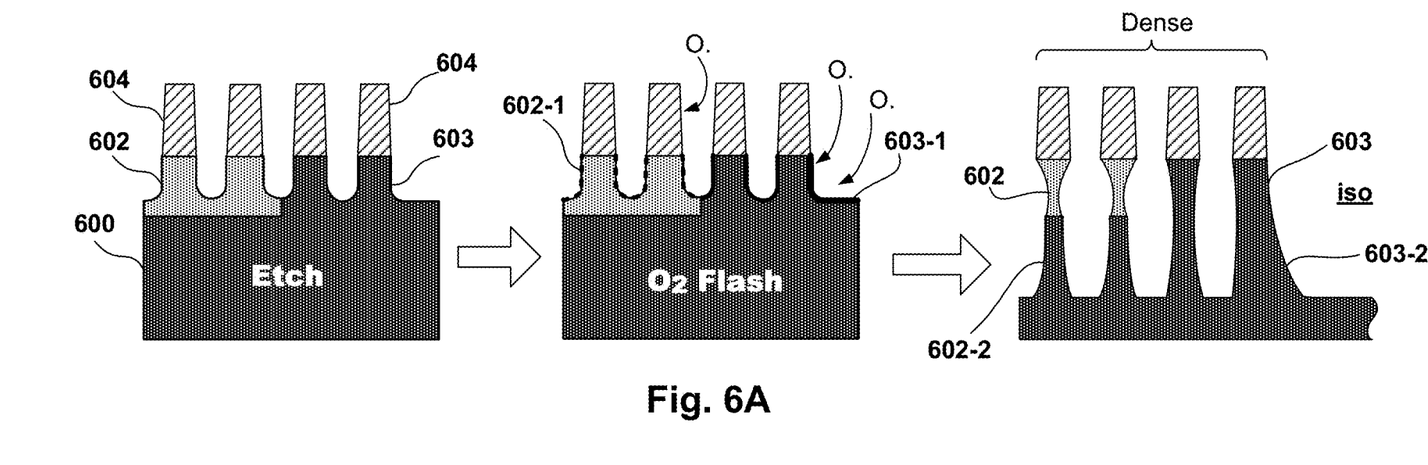
FIG. 6A shows the use of an $O_2$ flash, which is conducted in the same etch chamber in accordance with conventional processing techniques, as passivation for an etch process and illustrates how this results in the formation of an aspect ratio dependent and material dependent passivation.

FIG. 6A shows the use of an $O_2$ plasma flash, which is conducted in the same etch chamber in accordance with conventional processing techniques, as passivation for an etch process and illustrates how this results in the formation of an aspect ratio dependent and material dependent passivation. FIG. 6A shows a plurality of structures 602 and 603 defined in substrate 600 after a first etch process has been performed on the substrate in a plasma etch chamber. To enable the formation of two types of transistors (e.g., n-type and p-type), structures 602 (the two structures on the left) are formed of materials having chemical compositions different from the substrate material, e.g., silicon germanium (SiGe), and structures 603 (the two structures on the right) are formed of the substrate material, e.g., silicon. A portion of mask 604 used during the etch process is disposed over each of the structures 602 and 603. The first etch extends a first depth into the material of substrate 600, with the first depth being shallower than the final depth of the overall etch process that will be reached in one or more additional etch processes. After the first etch is performed, the $O_2$ plasma flash is used for passivation inside the same plasma etch chamber. During the $O_2$ plasma flash in which RF power is applied in the presence of oxygen gas, the oxygen in the thus-formed plasma causes oxidation to occur on the substrate. For example, structures 603, which are formed of silicon, react with the oxygen to create a film of $SiO_x$ passivation 603-1. Similarly, structures 602, which are formed of a different material, e.g., SiGe, react with the oxygen to create a film of passivation 602-1, e.g., $SiGeO_x$.

After the $O_2$ flash is performed, a second etch process is used to define the structures 602 and 603 to a second depth. During the second etch, the passivation films 602-1 and 603-1 are etched away. As the creation of these passivation films during the $O_2$ flash consumed material from the structures 602 and 603, the structures 602, 602-2 (formed of silicon), and 603 in the dense region have a bowed sidewall configuration after the etching process due to the material loss as well as the etching of the sidewalls. In particular, the $SiGeO_x$ passivation formed from the $O_2$ flash is weaker than the $SiO_x$ passivation and erodes faster than $SiO_x$ in the second etch. Consequently, there is a profile differential after the second etch. For example, in FIG. 6A, region 602 formed of, e.g., SiGe, is more bowed than region 602-2 formed of, e.g., Si. These bowed profiles are problematic because a bowed profile is not acceptable for FinFET transistors. The structure 603 located adjacent to the isolation ("iso") region (the structure 603 on the far right) has a thicker region 603-2 with a tapered profile due to increased exposure to oxygen radicals. In particular, the relatively open nature of the isolation ("iso") region allows more oxygen radicals to reach the structure and results in the formation of more passivation. This increased level of passivation leads to a more tapered silicon profile in the "iso" region after the second etch.

Figure 6B:
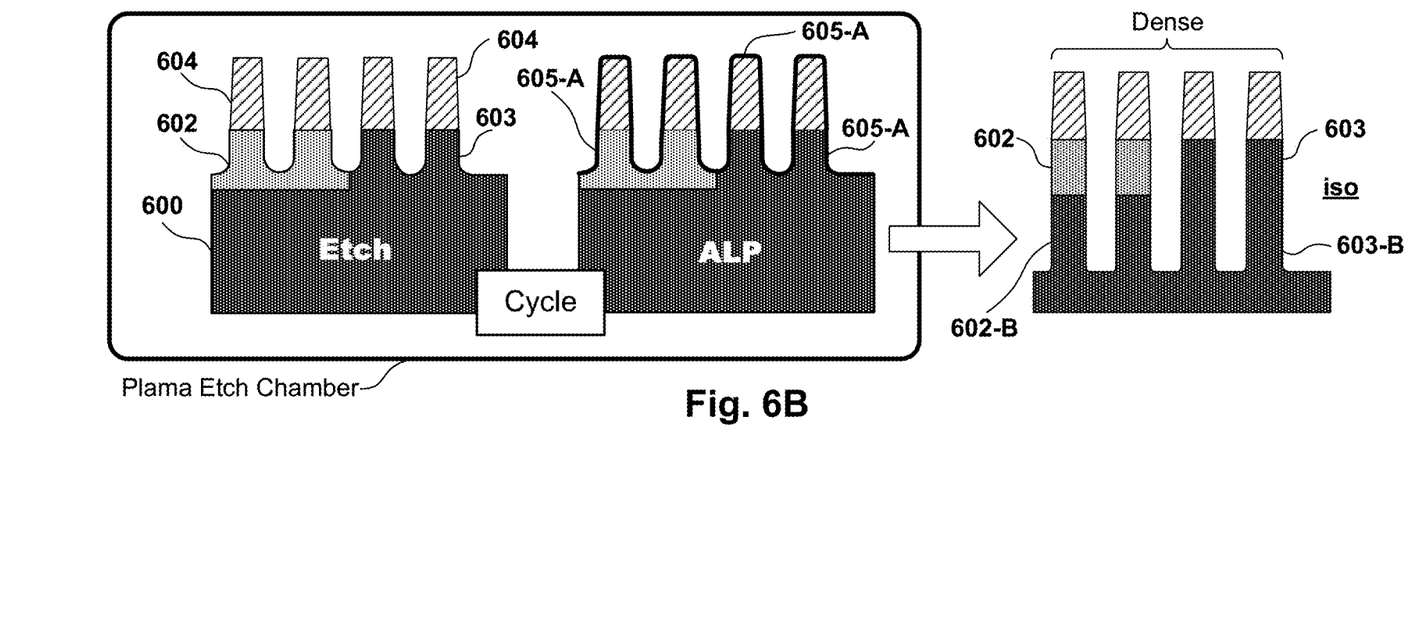
FIG. 6B shows the use of in-situ atomic layer passivation (ALP) for an etch process and illustrates how this results in the formation of an aspect ratio independent and material independent passivation, in accordance with one embodiment.

FIG. 6B shows the use of in-situ atomic layer passivation (ALP) for an etch process and illustrates how this results in the formation of an aspect ratio independent and material independent passivation, in accordance with one embodiment. Similar to FIG. 6A, FIG. 6B shows a plurality of structures 602 and 603 defined in substrate 600 after a first etch process has been performed on the substrate in a plasma etch chamber. Structures 602 (the two structures on the left) are formed of materials having chemical compositions different from the substrate material, e.g., silicon germanium (SiGe), and structures 603 (the two structures on the right) are formed of the substrate material, e.g., silicon. A portion of mask 604 used during the etch process is disposed over each of the structures 602 and 603. The first etch extends a first depth into the material of substrate 600, with the first depth being shallower than the final depth of the overall etch process that will be reached in one or more additional etch processes. After the first etch is performed, the substrate 600 remains in the plasma etch chamber and is subjected to the in-situ atomic layer passivation (ALP) process. As described herein, in the ALP process, the substrate 600 is coated with a self-limited monolayer from the vapor of a liquid precursor and then the precursor is cured by applying RF power to the electrodes of the plasma chamber along with an oxygen gas to perform a plasma flash process. The ALP process results in the formation of a film of passivation 605-A that uniformly coats the structures 602 and 603 and mask 604, with the thickness of the film being a function of the number of ALP cycles performed. Once the ALP process is completed and the plasma etch chamber is purged, a second etch process is performed on substrate 600, without removing the substrate from the plasma etch chamber, to define the structures 602 and 603 to a second depth. During the second etch, the passivation film 605-A is etched away. In contrast with the passivation films illustrated in FIG. 6A, the removal of passivation film 605-A does not involve any significant material loss because the ALP process provides an external source of passivation, namely, the liquid precursor which is supplied to the plasma etch chamber in vapor form. Consequently, the structures 602 and 603 in the dense region have a substantially uniform configuration after etching because any loss of critical dimension (CD) is minimal. This minimal CD loss reduces design rule violations, which must be satisfied during semiconductor fabrication processes. The structure 603 located adjacent to the isolation ("iso") region (the structure 603 on the far right) includes region 603-B. In contrast with the increased thickness of region 603-2 shown in FIG. 6A, region 603-B shown in FIG. 6B has a substantially uniform configuration because the passivation amount formed on the "iso" feature is the same as the passivation amount formed on the dense features through ALP.

As shown in FIG. 6B, ALP enables the same critical dimension (CD) between Si and SiGe because the passivation is material independent. That is, the ALP on both Si and SiGe have the same erosion rate during subsequent etch steps. Further, ALP eliminates the profile difference between Si and SiGe, namely, there is no taper/bow difference between features formed of these different materials.

As the ALP process entails the deposition of a film of passivation over a substrate while in the plasma etch chamber, the plasma etch chamber should be cleaned on a regular basis. In one embodiment, the plasma etch chamber is cleaned using a waferless auto-clean (WAC) process that is performed in between wafer processing. In one embodiment, the WAC process is performed after each wafer is processed. In another embodiment, the WAC process is performed after each lot of wafers is processed. Those skilled in the art will appreciate that the WAC process can be performed at any interval suitable to meet the needs of particular applications, e.g., after each wafer, after every other wafer, after every ten wafers, after every lot of wafers, etc.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 7:
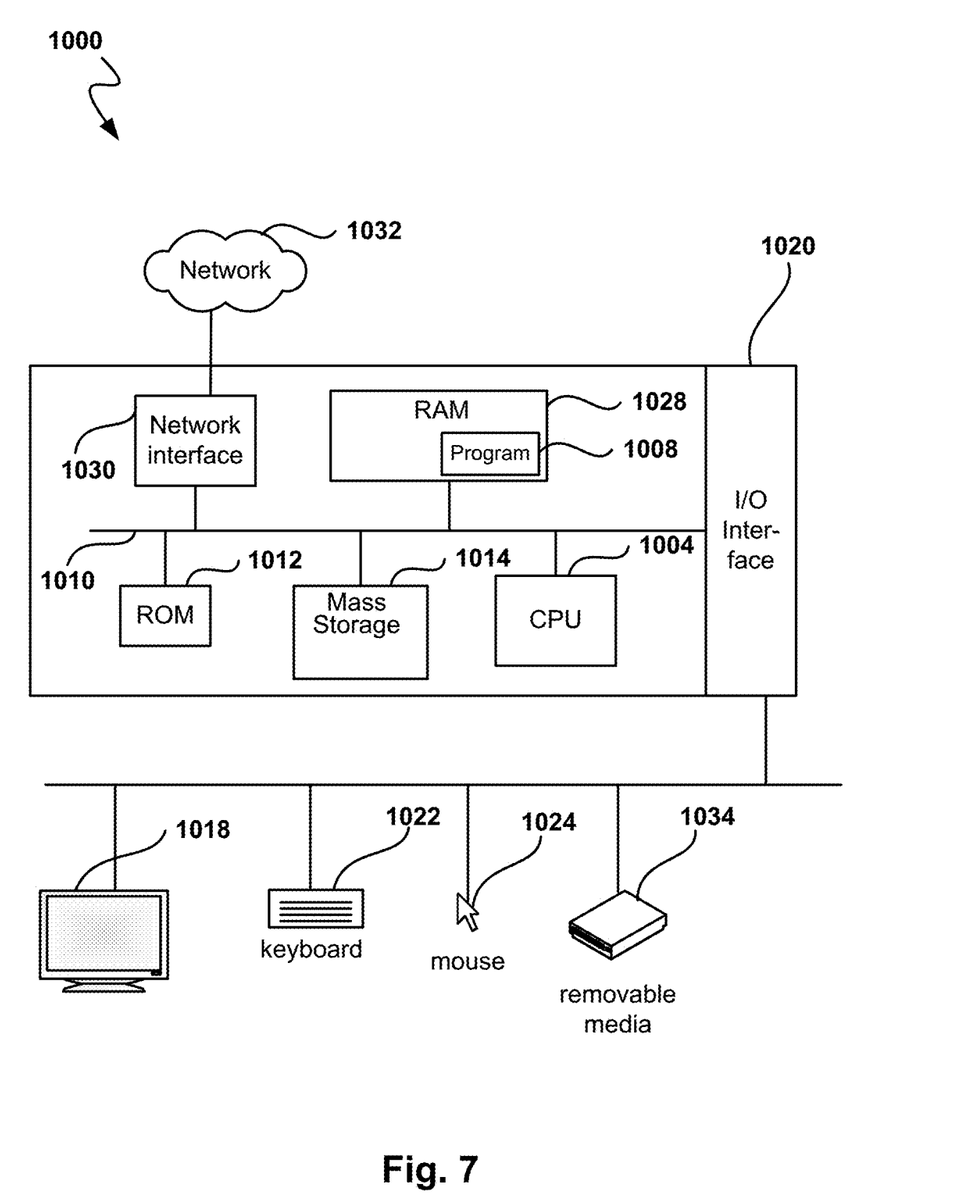
FIG. 7 is a simplified schematic diagram of a computer system for implementing embodiments of the present invention.

FIG. 7 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function may be used in the alternative. The computer system 1000 includes a central processing unit (CPU) 1004, which is coupled through bus 1010 to random access memory (RAM) 1028, read-only memory (ROM) 1012, and mass storage device 1014. System controller program 1008 resides in random access memory (RAM) 1028, but can also reside in mass storage 1014.

Mass storage device 1014 represents a persistent data storage device such as a floppy disc drive or a fixed disc drive, which may be local or remote. Network interface 1030 provides connections via network 1032, allowing communications with other devices. It should be appreciated that CPU 1004 may be embodied in a general-purpose processor, a special purpose processor, or a specially programmed logic device. Input/Output (I/O) interface 1020 provides communication with different peripherals and is connected with CPU 1004, RAM 1028, ROM 1012, and mass storage device 1014, through bus 1010. Sample peripherals include display 1018, keyboard 1022, cursor control 1024, removable media device 1034, etc.

Display 1018 is configured to display the user interfaces described herein. Keyboard 1022, cursor control (mouse)

1024, removable media device 1034, and other peripherals are coupled to I/O interface 1020 to communicate information in command selections to CPU 1004. It should be appreciated that data to and from external devices may be communicated through I/O interface 1020. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Accordingly, the disclosure of the example embodiments is intended to be illustrative, but not limiting, of the scope of the disclosures, which are set forth in the following claims and their equivalents. Although example embodiments of the disclosures have been described in some detail for purposes of clarity of understanding, it will be apparent that certain changes and modifications can be practiced within the scope of the following claims. In the following claims, elements and/or steps do not imply any particular order of operation, unless explicitly stated in the claims or implicitly required by the disclosure.

What is claimed is:

1. A method for etching a substrate in a plasma chamber, comprising,
   receiving the substrate in the plasma chamber over a bottom electrode, the substrate having a material to be etched to form features, with a mask being provided over the substrate to define locations of the features to be etched;
   performing, in the plasma chamber, a first etch of the material using a plasma etch process, the first etch using plasma etch gases to form features to a first depth in the material; and
   performing, in the plasma chamber, an atomic layer passivation (ALP) process to deposit a conformal film of passivation over the mask and the features formed during the first etch, the ALP process including,
   (a) introducing a vapor of a precursor including silicon into the plasma chamber to coat the mask and the features with the precursor;
   (b) generating a plasma within the plasma chamber in the presence of the precursor coated over the mask and features, the plasma generated using oxygen gas and RF power, the plasma causing the precursor to cure and form a first atomic monolayer of the conformal film of passivation;
   (c) introducing the vapor of the precursor including silicon into the plasma chamber to coat the first atomic monolayer of the conformal film of passivation with the precursor; and
   (d) generating a plasma within the plasma chamber in the presence of the precursor coated over first atomic monolayer, the plasma generated using the oxygen gas and the RF power, and the plasma causing the precursor to cure and form a second atomic monolayer of the conformal film of passivation,
   wherein the introducing of the vapor of the precursor and the generating of the plasma is repeated to form a third atomic monolayer or more atomic monolayers until the conformal film of passivation has a target thickness before performing a second etch of the material using the plasma etch process, the second etch using plasma etch gases to form features to a second depth in the material, the conformal film of passivation being configured to protect the mask and sidewalls of the features during the second etch.

2. The method of claim 1, wherein the conformal film of passivation is configured to enable etching of the features to the second depth with either a) minimal critical dimension loss, or b) minimal critical dimension loading between different materials and different aspect ratios, or c) minimal profile loading between different materials and different aspect ratios.

3. The method of claim 1, wherein the vapor of the precursor including silicon is introduced into the plasma chamber using a liquid delivery system, and the plasma etch gases are introduced into the plasma chamber using an etch gas delivery system, the liquid delivery system and the etch gas delivery system being coupled to manifolds controlled by a controller to introduce the plasma etch gases during the first etch and second etch of the material and to introduce the vapor of the precursor during the ALP process.

4. The method of claim 1, wherein during the ALP process, a purge of the plasma chamber is conducted after performing the introducing of the vapor of the precursor including silicon and the generating of plasma within the plasma chamber in the presence of the precursor, and wherein an ALP cycle is completed each time the introducing of the vapor of the precursor including silicon and the generating of plasma within the plasma chamber in the presence of the precursor is repeated.

5. The method of claim 1, wherein each ALP cycle produces a single atomic monolayer, and a conformal film having a specific target thickness can be formed by performing a specific number of said ALP cycles.

6. The method of claim 1, wherein during the ALP process, each time the introducing of the vapor of the precursor including silicon and the generating of plasma within the plasma chamber in the presence of the precursor is repeated, a single atomic monolayer of said conformal film of passivation is formed, and the thickness of the conformal film of passivation is defined by said single atomic monolayer or a plurality of atomic monolayers.

7. The method of claim 1, further comprising:
performing one or more additional etches after the second etch, wherein before each additional etch is performed, an ALP process is performed to form a respective conformal film of passivation, wherein the conformal film of passivation is defined by repeating the introducing of the vapor of the precursor including silicon and the generating of plasma within the plasma chamber in the presence of the precursor a number of times to reach the target thickness of the conformal film of passivation.

8. The method of claim 1, wherein the conformal film of passivation is deposited over the sidewalls of the features and the mask, without consuming any significant amount of material of the sidewalls of the features.

9. The method of claim 8, wherein the material to be etched is comprised of silicon, or silicon germanium, or germanium, and the conformal film of passivation does not consume any significant amount of material in the sidewalls of the features and forms passivation of substantially a same quality over different materials.

10. A method for etching a substrate in a plasma chamber, comprising,
receiving the substrate in the plasma chamber over a bottom electrode, the substrate having a material to be etched to form features, with a mask being provided over the substrate to define locations of the features to be etched;
performing, in the plasma chamber, a first etch of the material using a plasma etch process, the first etch using plasma etch gases to form features to a first depth in the material;
performing, in the plasma chamber, an atomic layer passivation (ALP) process to deposit a conformal film of passivation over the mask and the features formed during the first etch, the ALP process including,
(a) introducing a vapor of a precursor including silicon into the plasma chamber to coat the features and the mask with the precursor;
(b) using an $O_2$ plasma flash process in the plasma chamber, the $O_2$ plasma flash process including generating a plasma within the plasma chamber in the presence of the precursor coated over the features and the mask, the plasma generated using oxygen gas and RF power, the plasma causing the precursor to cure and form a first atomic monolayer of the conformal film of passivation;
(c) introducing the vapor of the precursor including silicon into the plasma chamber to coat the first atomic monolayer of the conformal film of passivation with the precursor; and
(d) using an $O_2$ plasma flash process in the plasma chamber, the $O_2$ plasma flash process including generating a plasma within the plasma chamber in the presence of the precursor coated over the first atomic monolayer of the conformal film of passivation, the plasma generated using oxygen gas and RF power, the plasma causing the precursor to cure and form a second atomic monolayer of the conformal film of passivation; and
performing, in the plasma chamber, a second etch of the material using the plasma etch process to form the features to a second depth in the material, the conformal film of passivation being configured to protect the mask and sidewalls of the features during the second etch.

11. The method of claim 10, wherein the conformal film of passivation is configured to enable etching of the features to the second depth with either a) minimal critical dimension loss, or b) minimal critical dimension loading between different materials and different aspect ratios, or c) minimal profile loading between different materials and different aspect ratios.

12. The method of claim 10, wherein the ALP process further includes:
(e) repeating the introducing of the vapor of the precursor including silicon and the using of the $O_2$ plasma flash process until a conformal film of passivation having a target thickness is formed.

13. The method of claim 10, wherein the vapor of a precursor including silicon is introduced into the plasma chamber using a liquid delivery system, and the plasma etch gases are introduced into the plasma chamber using an etch gas delivery system, the liquid delivery system and the etch gas delivery system being coupled to manifolds controlled by a controller to introduce the plasma etch gases during the first etch and the second etch of the material and to introduce the vapor of the precursor including silicon during the ALP process.

14. The method of claim 12, wherein during the ALP process, a purge of the plasma chamber is conducted after performing the introducing of the vapor of the precursor including silicon and the using of the $O_2$ plasma flash process, wherein an ALP cycle is completed each time the introducing of the vapor of the precursor including silicon and the using of the $O_2$ plasma flash process is repeated.

15. The method of claim 14, wherein each ALP cycle produces a single atomic monolayer, and a conformal film having a specific target thickness can be formed by performing a specific number of said ALP cycles with a substantially same thickness and substantially same quality on different materials and different aspect ratios.

16. The method of claim 12, wherein during the ALP process, each time the introducing of the vapor of the precursor including silicon and the using of the $O_2$ plasma flash process is repeated, a single atomic monolayer of said conformal film of passivation is formed, and the thickness of the conformal film of passivation is defined by said single atomic monolayer or a plurality of atomic monolayers.

* * * * *